US011136502B2

(12) United States Patent
Ooguri

(10) Patent No.: US 11,136,502 B2
(45) Date of Patent: Oct. 5, 2021

(54) METHOD OF PRODUCING THIOGALLATE-BASED FLUORESCENT MATERIAL, METHOD OF PRODUCING LIGHT-EMITTING DEVICE, THIOGALLATE-BASED FLUORESCENT MATERIAL AND LIGHT-EMITTING DEVICE

(71) Applicant: NICHIA CORPORATION, Anan (JP)

(72) Inventor: Hirofumi Ooguri, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 857 days.

(21) Appl. No.: 15/827,503

(22) Filed: Nov. 30, 2017

(65) Prior Publication Data
US 2018/0155619 A1    Jun. 7, 2018

(30) Foreign Application Priority Data
Dec. 2, 2016   (JP) .............................. JP2016-235102

(51) Int. Cl.
C09K 11/77    (2006.01)
C09K 11/61    (2006.01)
C09K 11/08    (2006.01)
H01L 33/26    (2010.01)
H01L 33/50    (2010.01)
H01J 61/44    (2006.01)

(52) U.S. Cl.
CPC .......... C09K 11/7731 (2013.01); H01J 61/44 (2013.01); H01L 33/26 (2013.01); H01L 33/502 (2013.01); *C09K 2211/181* (2013.01); *C09K 2211/182* (2013.01); *C09K 2211/188* (2013.01)

(58) Field of Classification Search
CPC ............ C09K 11/7734; C09K 11/7731; C09K 11/616; C09K 11/7702; C09K 11/7703; C09K 11/772; C09K 11/773; C09K 11/675; C09K 11/643; C09K 11/02; C09K 11/0833; C09K 11/576; C09K 11/615; C09K 11/665; C09K 11/645; C09K 11/55; C09K 11/565; C09K 11/61; C09K 11/7715; C09K 11/7718; C09K 2211/188; C09K 2211/181
USPC .................................................... 252/301.4 F
See application file for complete search history.

(56) References Cited

U.S. PATENT DOCUMENTS 2,210,405 A    8/1940  Haywood
6,924,233 B1 *  8/2005  Chua ....................... H01L 33/50
                                                         438/144
7,959,321 B2    6/2011  Ryu et al.
8,017,961 B2    9/2011  Kim et al.
8,088,302 B2    1/2012  Kim et al.
8,132,952 B2    3/2012  Ryu et al.
2004/0195548 A1* 10/2004  Hampden-Smith .........................
                                                       C09K 11/0805
                                                         252/301.6 S
2007/0040822 A1*  2/2007  Koyama .............. G09G 3/3674
                                                             345/204
2009/0096350 A1   4/2009  Kim et al.
2009/0191228 A1   7/2009  Gebbink et al.
2009/0191229 A1   7/2009  Macdonald et al.
2010/0177534 A1   7/2010  Ryu et al.
2011/0026242 A1   2/2011  Ryu et al.
2011/0227476 A1*  9/2011  Zhang ................. C04B 35/6268
                                                             313/503
2016/0061418 A1*  3/2016  Izawa ....................... F21K 9/64
                                                            362/97.1
2016/0222287 A1   8/2016  Yagihashi
2017/0183566 A1   6/2017  Ooguri

FOREIGN PATENT DOCUMENTS

JP    2008537629 A    9/2008
JP    2009507935 A    2/2009
JP    2011-236310 A   11/2011
JP    2015-059202 A    3/2015
(Continued)

OTHER PUBLICATIONS

Braunger, D. et al. "Improved Growth of $SrGa_2S_4$ Thin Film Electroluminescence Phosphors" Materials Research Society Symposium, vol. 424, (1997), pp. 453-458.
(Continued)

Primary Examiner — Matthew E. Hoban
Assistant Examiner — Lynne Edmondson
(74) Attorney, Agent, or Firm — Hunton Andrews Kurth LLP

(57) ABSTRACT

Provided are a method of producing a thiogallate-based fluorescent material, a method of producing a light-emitting device, a thiogallate-based fluorescent material, and a light-emitting device. The method of producing a thiogallate-based fluorescent material includes preparing a first solution containing at least one M1 ion selected from the group consisting of Sr, Be, Mg, Ca, Ba and Zn, and at least one M2 ion selected from the group consisting of Eu and Ce, and a second solution containing a sulfite ion, simultaneously supplying the first solution and the second solution to a reactor to obtain a powder containing a sulfite that contains an element M1 and an element M2, mixing a raw material that contains the powder containing the sulfite that contains the element M1 and the element M2 and a powder containing a gallium compound, with lithium chloride to obtain a mixture, and heat-treating the mixture to obtain a thiogallate-based fluorescent material.

20 Claims, 1 Drawing Sheet

(56) References Cited

FOREIGN PATENT DOCUMENTS

| | | |
|---|---|---|
| JP | 2017119745 A | 7/2017 |
| WO | 2010/029654 A1 | 3/2010 |
| WO | 2015040855 A1 | 3/2015 |

OTHER PUBLICATIONS

U.S. Appl. No. 15/389,628, Restriction Requirement dated Jun. 20, 2019, 8 pages.
U.S. Appl. No. 15/389,628, Non-Final Rejection dated Oct. 31, 2019, 15 pages.

* cited by examiner

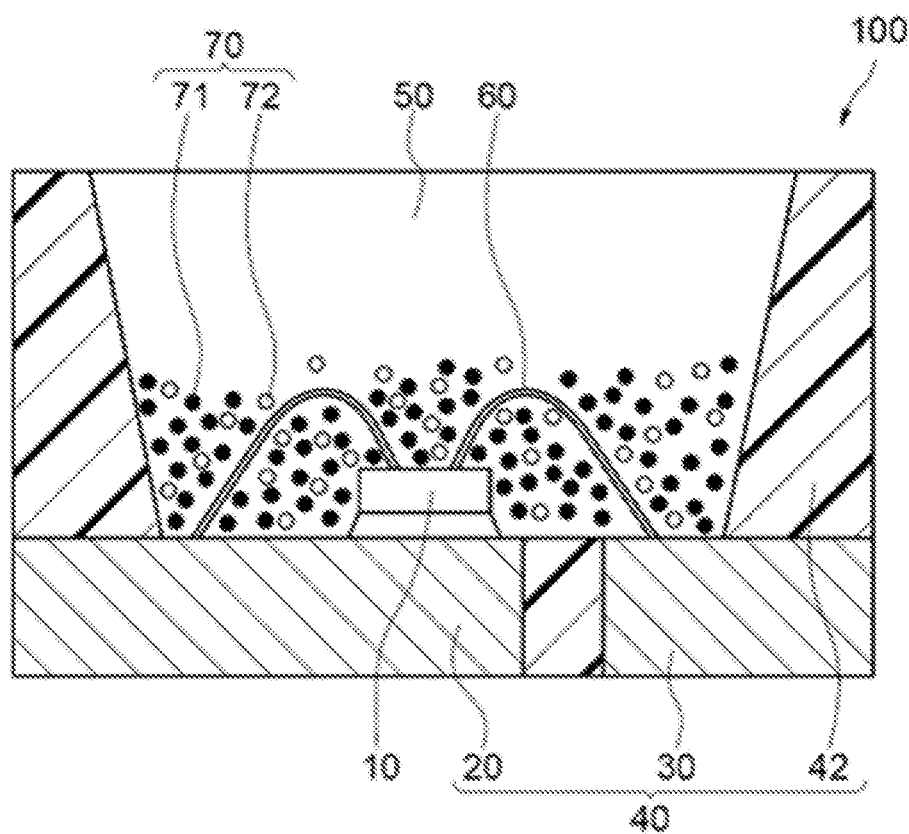

METHOD OF PRODUCING THIOGALLATE-BASED FLUORESCENT MATERIAL, METHOD OF PRODUCING LIGHT-EMITTING DEVICE, THIOGALLATE-BASED FLUORESCENT MATERIAL AND LIGHT-EMITTING DEVICE

CROSS-REFERENCE TO RELATED APPLICATIONS

This application claims priority to Japanese Patent Application No. 2016-235102, filed on Dec. 2, 2016, the disclosure of which is hereby incorporated by reference in its entirety.

BACKGROUND

Technical Field

The present disclosure relates to a method of producing a thiogallate-based fluorescent material, a method of producing a light-emitting device, a thiogallate-based fluorescent material, and a light-emitting device.

Description of Related Art

Various light-emitting devices having good color rendering properties and capable of emitting white light have been developed by combining a light source of blue light-emitting diode (LED) chips, a green-emitting fluorescent material and a red-emitting fluorescent material. As the green-emitting fluorescent material, for example, a sulfide fluorescent material is known; and as a red-emitting fluorescent material, for example, a fluoride fluorescent material having a composition of $K_2SiF_6$:Mn is known.

Various methods have been proposed for a method of producing a green-emitting sulfide fluorescent material. For example, Japanese Unexamined Patent Publication No. 2011-236310 discloses a method of producing a thiogallate-based fluorescent material, a type of sulfide fluorescent material, in which a sulfite is added to a solution that contains an europium compound and a strontium compound to give a powder containing europium and strontium. Then, the powder is mixed with a powdery gallium compound, and heat-treated to give particles of a thiogallate-based fluorescent material, or a powdery gallium compound is added to a solution containing an europium compound and a strontium compound, then a sulfite is added thereto to give a powdery mixture of a powder containing europium and strontium and a powdery gallium compound (mixed powder), and the powder (mixed powder) is heat-treated to give particles of a thiogallate-based fluorescent material.

Japanese Unexamined Patent Publication No. 2015-059202 discloses a method of producing a thiogallate-based fluorescent material, in which a mixed solution containing a europium compound, a strontium compound, and a calcium compound is dropwise added to a sulfite solution that contains a powdery gallium compound to give a powdery mixture of a sulfite containing Sr, Ca, Eu and Ga, and then the powdery mixture is heat-treated to produce a thiogallate-based fluorescent material represented by a compositional formula: $(Sr_{1-w}Ca_w)_{1-v}Ga_2S_4$:$Eu_v$ (0.03≤w≤0.20, 0<v≤1)

International Unexamined Patent Application Publication No. WO2010/029654 discloses a method of producing a thiogallate-based fluorescent material using a sulfide such as strontium sulfide, gallium sulfide, europium sulfide as a starting material along with a flux, in which the material and the flux are heat-treated in hydrogen sulfide at a temperature of 1,000° C. or higher and then ground to give a thiogallate-based fluorescent material.

SUMMARY

A sulfide fluorescent material is desired to have further increased emission intensity. Emission intensity is known to have a relation with the size of a fluorescent material. A fluorescent material tends to have increased emission intensity with increase in the particle size thereof, and a light-emitting device using the fluorescent material tends to have an increased luminous flux. Accordingly, it is desired to develop a thiogallate-based fluorescent material having a further larger particle size.

However, for example, in the case where a strontium-containing sulfite produced according to the method of adding a solution containing a sulfite to a solution containing strontium as disclosed in the Japanese Unexamined Patent Publication No. 2011-236310, or a strontium-containing sulfite produced according to the method of adding a solution containing a sulfite to a solution containing strontium as disclosed in the Japanese Unexamined Patent Publication No. 2015-059202 is used, or in the case where the flux disclosed in the International Unexamined Patent Application Publication No. WO2010/029654 is used, a thiogallate-based fluorescent material having a small particle size and a low emission intensity tends to be obtained.

The present disclosure is to provide a method of producing a thiogallate-based fluorescent material capable of preventing emission intensity depression and having a larger particle size, a method of producing a light-emitting device, a thiogallate-based fluorescent material and a light-emitting device.

Specific means for solving the above-mentioned problems are as follows, and the present disclosure includes the following embodiments.

The first embodiment of the present disclosure is a method of producing a thiogallate-based fluorescent material, includes:

preparing a first solution (a1) containing at least one M1 ion selected from the group consisting of strontium, beryllium, magnesium, calcium, barium and zinc, and at least one M2 ion selected from the group consisting of europium and cerium, and a second solution (b1) containing a sulfite ion, simultaneously supplying the first solution (a1) and the second solution (b1) to a reactor to obtain a powder containing a sulfite that contains an element M1 and an element M2 in a reaction system that contains the M1 ion, the M2 ion and the sulfite ion, mixing a raw material that contains the powder containing the sulfite that contains the element M1 and the element M2 and a powder containing a gallium compound, with lithium chloride to obtain a mixture, and heat-treating the mixture to obtain a thiogallate-based fluorescent material, wherein:

the amount of lithium chloride is in a range of more than 1.7 parts by mass to less than 10.2 parts by mass relative to 100 parts by mass of the gallium element contained in the gallium compound powder.

The second embodiment of the present disclosure is a method of producing a thiogallate-based fluorescent material, includes preparing a third solution (a2) containing at least one M1 ion selected from the group consisting of strontium, beryllium, magnesium, calcium, barium and zinc, a fourth solution (a3) containing at least one M2 ion selected from the group consisting of europium and cerium, and a second solution (b1) containing a sulfite ion, simultaneously supplying the third solution (a2), the fourth solution (a3) and the second solution (b1) to a reactor to obtain a powder containing a sulfite that contains an element M1 and an element M2 in a reaction system that contains the M1 ion, the M2 ion and the sulfite ion, mixing a raw material that contains the powder containing the sulfite that contains the element M1 and the element M2 and a powder containing a gallium compound, with lithium chloride to obtain a mixture, and heat-treating the mixture to obtain a thiogallate-based fluorescent material, wherein the amount of lithium chloride is in a range of more than 1.7 parts by mass to less than 10.2 parts by mass relative to 100 parts by mass of the gallium element contained in the gallium compound powder.

The third embodiment of the present disclosure is a method of producing a light-emitting device, which includes a step of producing a light-emitting device using the thiogallate-based fluorescent material produced according to the above-mentioned production method, a light source that emits light having an emission peak wavelength in a range of 420 nm or more and 480 nm or less, and a fluorescent material that emits fluorescence in a range of yellow red to red.

The fourth embodiment of the present disclosure is a thiogallate-based fluorescent material having an average particle diameter measured by the F. S. S. S. (Fisher Sub Sieve Sizer) method in a range of 10.1 μm or more and 25.0 μm or less, and a ratio (Dm2/Dm1) of a median particle diameter (Dm2) measured by the coulter counter method to the average particle diameter (Dm1) measured by the F. S. S. S. method in a range of 1.0 or more to 2.5 or less, containing at least one element M1 selected from the group consisting of strontium, beryllium, magnesium, calcium, barium and zinc, at least one element M2 selected from the group consisting of europium and cerium, and gallium and sulfur, and containing a lithium element in an amount in a range of 750 ppm or more to 4,000 ppm or less.

The fifth embodiment of the present disclosure is a light-emitting device including the above-mentioned thiogallate-based fluorescent material, a light source that emits light having an emission peak wavelength in a range of 420 nm or more and 480 nm or less, and a fluorescent material that emits fluorescence in a range of yellow red to red.

According to the present disclosure, a method of producing a thiogallate-based fluorescent material capable of preventing emission intensity depression and having a larger particle size, a method of producing a light-emitting device, a thiogallate-based fluorescent material, and a light-emitting device are provided.

BRIEF DESCRIPTION OF DRAWINGS

FIG. 1 is a schematic cross-sectional view showing an example of a light-emitting device according to an embodiment of the present disclosure.

DETAILED DESCRIPTION

The method of producing a thiogallate-based fluorescent material, the method of producing a light-emitting device, the thiogallate-based fluorescent material and the light-emitting device of the present invention are described below with reference to embodiments and examples. The production methods and others described below are merely to embody the technical idea of the present invention and are not to specifically limit the present invention to the following.

The relation between the wavelength ranges of light and the color names of single color light conforms to JIS Z8110.

In this description, the term "step" includes not only an independent step but also any others that could not be definitely differentiated from other steps but could attain the expected object of the step. Unless otherwise specifically indicated, the content of each component in a composition means, in the case where plural kinds of substances corresponding to each component exist in the composition, the total amount of the plural substances existing in the composition.

According to the first embodiment of the present disclosure, the production method for a thiogallate-based fluorescent material includes the following steps.

Step (A1): A step of preparing a first solution (a1) containing at least one M1 ion selected from the group consisting of strontium (Sr), beryllium (Be), magnesium (Mg), calcium (Ca), barium (Ba) and zinc (Zn), and at least one M2 ion selected from the group consisting of europium (Eu) and cerium (Ce), and a second solution (b1) containing a sulfite ion.

Step (B1): A step of simultaneously supplying the first solution (a1) and the second solution (b1) to a reactor to obtain a powder containing a sulfite that contains an element M1 and an element M2 in a reaction system that contains the M1 ion, the M2 ion and the sulfite ion.

Step (C): A step of mixing a raw material that contains the powder containing the sulfite that contains the element M1 and the element M2 and a powder containing a gallium compound, with lithium chloride to give a mixture.

In this, the amount of lithium chloride is in a range of more than 1.7 parts by mass to less than 10.2 parts by mass relative to 100 parts by mass of the gallium element contained in the gallium compound powder.

Step (D): A step of heat-treating the mixture to give a thiogallate-based fluorescent material.

In the step (B1), the first solution (a1) and the second solution (b1) are simultaneously supplied to a reactor, and accordingly, the sulfite ion (anion) contained in the solution (b1) and the M1 ion and the M2 ion (cations) contained in the solution (a1) react nearly in an equivalent state. Any one of cation or anion does not exist largely excessively. Therefore the anion and the cation react gently so that the growth of the formed primary particles could take priority over the formation of primary particles and a powder containing a sulfite of large and dense primary particles containing the element M1 and the element M2 can be obtained. In addition, since the resultant primary particles of the powder of the sulfite that contains the element M1 and the element M2 are large and dense, the thiogallate-based fluorescent material to be obtained after heat treatment can have a high relative emission intensity because the particle size of the primary particles is large. The powder of the sulfite that contains the element M1 and the element M2 obtained in the step (B1) contains primary particles and secondary particles formed by aggregation of primary particles.

On the other hand, in the case where a sulfite ion or the other ion of an M1 ion and an M2 ion is supplied and reacted in a reaction system where the sulfite ion contained in the second solution (b1) or any one of the M1 ion and the M2 ion contained in the first solution (a1) exists largely excessively as conventionally, the reaction speed is too rapid since any one ion of the anion or the cation exists largely excessively, and therefore the formation of a large number of primary particles would take priority. In general, when particles are small, aggregation thereof readily occurs, and therefore primary particles aggregate before the growth of the particles so that secondary particles having many voids are formed through aggregation of the aggregates of small primary particles. The resultant powder containing the sulfite contains small primary particles and has many voids. In the thiogallate-based fluorescent material obtained after heat treatment of the powder containing the sulfite of the type, the particle size of the primary particles is smaller than that in the case where the above-mentioned powder containing the sulfite of primary particles having a large particle size is used, and therefore the relative emission intensity thereof is low.

In the step (C), the amount of lithium chloride is in a range of more than 1.7 parts by mass to less than 10.2 parts by mass relative to 100 parts by mass of the gallium element contained in the gallium compound powder. In the step (C), an adequate amount of lithium chloride is made to exist in the reaction system along with a raw material that contains the powder containing the sulfite that contains the element M1 and the element M2 and having large and dense primary particles and contains a gallium compound powder, and accordingly, in heat treatment in the step (D), lithium chloride can act as a flux. In the step (D), lithium chloride acting as a flux can promote the solid-phase reaction between the materials, therefore preventing the relative emission intensity from lowering, and accordingly, a thiogallate-based fluorescent material of primary particles having a further larger particle size can be obtained. The light-emitting device using the thiogallate-based fluorescent material of primary particles having a large particle size can be improved in point of the charging performance of the fluorescent material therein, and can therefore secure an increased relative luminous flux.

As the flux, an alkali metal or alkaline earth metal halide may be used as the case may be. In the case where any other alkali metal chloride than lithium chloride, such as sodium chloride (NaCl), potassium chloride (KCl), or rubidium chloride (RbCl) is used in the step of producing the mixture, the crystal growth could be promoted a little and the particle size of the thiogallate-based fluorescent material to be produced could be large in some degree, but as compared with the case where lithium chloride is used, the emission intensity tends to further lower in that case.

In the case where an alkaline earth metal halide, for example, an alkaline earth metal chloride such as magnesium chloride (($MgCl_2$), calcium chloride ($CaCl_2$), strontium chloride ($SrCl_2$), barium chloride ($BaCl_2$) is used as the flux, the resultant thiogallate-based fluorescent material dissolves in solid, and therefore the crystals do not grow and growth of the primary particles is hardly promoted.

In the case where any other lithium halide than lithium chloride, such as lithium fluoride (LiF), lithium bromide (LiBr) or lithium iodide (LiI) is used as the flux, the crystal growth could be promoted in the heat treatment step and therefore the particle size could be large, but as compared with that in the case where lithium chloride is used, the emission intensity may lower, or the particle size could not be so large and the emission intensity tends to lower.

Step (A1)

A first solution (a1) and a second solution (b1) are prepared.

First Solution (a1)

The first solution (a1) is prepared from a compound containing at least one element M1 selected from the group consisting of strontium (Sr), beryllium (Be), magnesium (Mg), calcium (Ca), barium (Ba) and zinc (Zn), a compound containing at least one element M2 selected from the group consisting of europium (Eu) and cerium (Ce), and a solvent dissolving these compounds. The solvent may be any one that dissolves the compound containing the element M1 and the compound containing the element M2 but does not react with the compounds, and above all, pure water is preferred in that the content of impurities therein is small.

The compound containing the element M1 may be any one that dissolves in the solvent, and from the viewpoint of easy availability, a chloride containing at least one element M1 selected from the group consisting of Sr, Be, Mg, Ca, Ba and Zn may be used.

The compound containing the element M2 may be any one that dissolves in the solvent, and from the viewpoint of easy availability, a chloride containing at least one element M2 selected from the group consisting of Eu and Ce may be used. The chloride may be a hydrate.

The content of the M1 ion and the M2 ion in the first solution (a1) may be adequately controlled within a range where the compound containing the element M1 and the compound containing the element M2 could substantially dissolve in the solvent. For example, when $SrCl_2$ is used as the compound containing the element M1, $EuCl_3$ is used as the compound containing the element M2, and pure water is used as the solvent, the solution (a1) is so prepared that the content of the element M1 could be in a range of 10.0% by mass or more to 20.0% by mass or less as the solid fraction in the total amount of the solution (a1), and the content of the element M2 could be in a range of 0.5% by mass or more to 8.0% by mass or less as the solid fraction therein.

Second Solution (b1)

The second solution (b1) is a solution containing a sulfite ion. A compound containing a sulfite ion includes a sulfite. Among sulfites, ammonium sulfite is preferred as not containing a metal element. The solvent may be any one capable of dissolving the sulfite ion-containing compound but does not react with the compound. Above all, pure water is preferred from the viewpoint that the content of impurities therein is small. The content in the second solution (b1) is adequately controlled within a range where the compound therein could dissolve in the solvent. For example, when ammonium sulfite is used as the sulfite ion-containing compound and pure water is used as the solvent, the second solution (a1) is so prepared that the sulfite ion content in the total amount of the second solution (b1) could be in a range of 10.0% by mass or more to 30.0% by mass or less.

Preferably, the pH of the second solution (b1) is controlled to fall within a range of 7.0 or more to 8.5 or less. When the pH of the second solution (b1) is controlled to fall within a range of 7.0 or more to 8.5 or less, the pH does not vary greatly in the reaction system in the next step of producing a powder, and therefore the M1 ion, the M2 ion and the sulfite ion could be reacted gently.

Preferably, the equivalent ratio of the sulfite ion contained in the second solution (b1) is within a range of 1.01 or more to 1.30 or less relative to 1, the total of the M1 ion and the M2 ion. More preferably, the equivalent ratio of the sulfite ion contained in the second solution (b1) is within a range of 1.05 or more to 1.20 or less relative to 1, the total of the M1 ion and the M2 ion, even more preferably within a range of 1.08 or more to 1.18 or less.

When the equivalent ratio of the sulfite ion contained in the second solution (b1) is within a range of 1.01 or more to 1.30 or less relative to 1, the total of the M1 ion and the M2 ion, the sulfite ion would not be too much excessively relative to the total of the M1 ion and the M2 ion when the first solution (a1) and the second solution (b1) are separately but simultaneously supplied in a reactor, and therefore the M1 ion, the M2 ion and the sulfite ion could react gently to give a powder containing a sulfite that contains the element M1 and the element M2 and having a large particle size.

In this description, the equivalent ratio of the sulfite ion relative to the total of the M1 ion and the M2 ion means the ratio of the molar number of the sulfite ion to the molar number, referred to as one mol, of the total of the M1 ion and the M2 ion.

Pre-Step (pB)

In a preferred embodiment of the present disclosure, the production method of a thiogallate-based fluorescent material preferably further includes previously supplying to the reactor a sulfite ion-containing fifth solution (b2) in which the equivalent ratio of the sulfite ion is 0.2 or less relative to 1, the total of the M1 ion and the M2 ion, separately from the second solution (b1) and prior to supplying the second solution (b1) to the reactor. Regarding the equivalent ratio of the sulfite ion in the fifth solution (b2) relative to 1, the total of the M1 ion and the M2 ion, the sulfite-containing fifth solution (b2) is made to exist in the reactor prior to supplying the second solution (b1) to the reactor (pre-step (pB)), and accordingly, the pH in the reaction system does not vary greatly in simultaneously supplying the first solution (a1) and the second solution (b1) to the reactor, and the M1 ion, the M2 ion and the sulfite ion can therefore react gently.

Fifth Solution (b2)

Regarding the fifth solution (b2), a part of the second solution (b1) may be used as the fifth solution (b2) so that the equivalent ratio of the sulfite ion to 1, the total of the M1 ion and the M2 ion could be 0.2 or less. Even in the case where a part of the second solution (b1) is used so that the sulfite ion could be in a predetermined equivalent ratio, preferably, the fifth solution (b2) is supplied to the reactor separately from the second solution (b1) before the second solution (b1) is supplied to the reactor.

The equivalent ratio of the sulfite ion in the fifth solution (b2) is more preferably 0.18 or less relative to 1, the total of the M1 ion and the M2 ion, more preferably 0.15 or less, even more preferably 0.12 or less. The equivalent ratio of the sulfite ion in the fifth solution (b2) is preferably within the range where the pH of the reaction system does not vary greatly. In the fifth solution (b2), preferably, the equivalent ratio of the sulfite ion to 1, the total of the M1 ion and the M2 ion is 0.05 or more.

Preferably, the fifth solution (b2) is controlled to have a pH falling within a range of 7.0 or more to 8.5 or less. When the pH of the fifth solution (b2) is controlled to fall within a range of 7.0 or more to 8.5 or less, the pH of the reaction system does not vary greatly when the first solution (a1) and the second solution (b1) are supplied simultaneously to the reactor, and therefore the M1 ion, the M2 ion and the sulfite ion can react gently.

Step (B1)

The first solution (a1) containing the M1 ion and the M2 ion and the second solution (b1) containing a sulfite ion are simultaneously suppled to the reactor. The first solution (a1) and the second solution (b1) are separately but simultaneously supplied to the reactor.

In this description, "simultaneously" means that there exists a time when both the first solution (a1) containing the M1 ion and the M2 ion and the second solution (b1) containing a sulfite ion are supplied to the reactor, or the time at which supplying the first solution (a1) containing the M1 ion and the M2 ion to the reactor is started and the time at which supplying the second solution (b1) containing a sulfite ion thereto is started are the same. Desirably, the time at which supplying the first solution (a1) to the reactor is ended and the time at which supplying the second solution (b1) thereto is ended are the same, but the end time of supply may somewhat differ therebetween.

Preferably, the solution in the reactor is stirred therein. The stirring speed may differ depending on the size of the reactor and the amount of each solution to be supplied to the reactor, and is not specifically defined.

Preferably, the pH of the reaction system is controlled to fall within a range of 5.0 or more to 8.5 or less, more preferably within a range of 5.0 or more to 6.0 or less.

When the pH of the reaction system is 5.0 or more, the precipitation efficiency of the powder containing the sulfite that contains the element M1 and the element M2 does not lower in producing the powder containing the sulfite that contains the element M1 and the element M2. When the pH of the reaction system is 8.5 or less, the M1 ion, the M2 ion and the sulfite ion react gently to give the powder containing the sulfite that contains the element M1 and the element M2 and having a large particle size.

Preferably, the temperature of the reaction system is 15° C. or more and 30° C. or less, more preferably 15° C. or more and 25° C. or less.

When the temperature of the reaction system is 15° C. or more, the powder containing the sulfite that contains the element M1 and the element M2 can readily precipitate. When the temperature of the reaction system is 30° C. or less, the M1 ion, the M2 ion and the sulfite ion react gently to give the powder containing the sulfite that contains the element M1 and the element M2 and having a large particle size.

The supply time of each solution to the reactor and the reaction time vary depending on the total amount of the reaction system.

A gallium compound may be present in the reaction system. The gallium compound that may be present in the reaction system may be in an amount to constitute a part of gallium constituting the thiogallate-based fluorescent material. Preferably, the gallium compound is a compound not interfering with the reaction of forming the powder containing the sulfite that contains the element M1 and the element M2. The gallium compound includes an oxide, a carbonate, a sulfide or the like that contains gallium.

In a preferred embodiment of the present invention, the method may include solid-liquid separation for the powder containing the sulfite that contains the element M1 and the element M2 after the step (B1). The resultant powder containing the sulfite precipitate that contains the element M1 and the element M2 is dewatered through filtration, dried and sieved in dry. Solid-liquid separation gives the sulfite powder containing the element M1 and the element M2.

Step (C)

A raw material that contains a powder containing a sulfite that contains the element M1 and the element M2, and a powder containing a gallium compound, is mixed with lithium chloride to prepare a mixture.

The amount of lithium chloride is in a range of more than 1.7 parts by mass to less than 10.2 parts by mass relative to 100 parts by mass of the gallium element contained in the gallium compound powder. Preferably, the amount of lithium chloride is in a range of 2 parts by mass or more to 9.5 parts by mass or less relative to 100 parts by mass of the gallium element contained in the gallium compound powder, more preferably in a range of 2.5 parts by mass or more to 8.5 parts by mass or less, even more preferably in a range of 3.0 parts by mass or more to 7.0 parts by mass or less.

When the amount of lithium chloride is 1.7 parts by mass or less relative to 100 parts by mass of the gallium element contained in the gallium compound powder, it would be difficult to prevent the emission intensity of the resultant thiogallate-based fluorescent material from lowering. When the amount of lithium chloride is 10.2 parts by mass or more relative to 100 parts by mass of the gallium element contained in the gallium compound powder, the particle size of the resultant thiogallate-based fluorescent material could be large but the emission intensity thereof greatly lowers.

The raw material contains the powder containing the sulfite that contains the element M1 and the element M2 and the gallium compound powder. The gallium compound may be added to the reaction system, or may be added to the raw material.

Regarding mixing, for example, the powder containing the sulfite that contains the element M1 and the element M2, the gallium compound powder, and lithium chloride, and optionally any other compounds are uniformly mixed, using for example a super mixer manufactured by KAWATAMFG Co., Ltd, to obtain a powdery mixture.
Step (D)

The resultant mixture is heat-treated to give a thiogallate-based fluorescent material.

Regarding the heat treatment temperature, the mixture having a predetermined composition is heat-treated at a temperature of preferably 850° C. or higher in a hydrogen sulfide atmosphere, thereby efficiently producing fluorescent material particles having a desired composition and having a large particle size. The heat treatment temperature is preferably 900° C. or more. The upper limit of the heat treatment temperature is, for example, lower than the melting point of the fluorescent material particles that may vary depending on the composition of the fluorescent material particles, and is preferably 1,200° C. or lower, more preferably 1,100° C. or lower.

Preferably, the mixture is heat-treated in a hydrogen sulfide gas ($H_2S$) atmosphere. The heat treatment atmosphere may contain at least hydrogen sulfide, and may optionally contain any other vapor than hydrogen sulfide. The other vapor than hydrogen sulfide includes an inert gas such as nitrogen, etc., carbon disulfide ($CS_2$), etc. The hydrogen sulfide concentration in the hydrogen sulfide atmosphere in which the mixture is heat-treated is not specifically limited, and may be, for example, 90% by volume or more, preferably 95% by volume or more.

The pressure in heat treatment may be, for example, in a range of 0.1 MPa or more to 0.3 MPa or less. Preferably, the pressure in heat treatment is 0.1 MPa (normal pressure). When the pressure inside the device for heat treatment of the mixture is too high, hydrogen sulfide would unfavorably leak out from the device toward the external environment.

The heat treatment time is not specifically limited so far as the thiogallate-base fluorescent material having a desired particle size could be obtained with the time. The heat treatment time is, for example, preferably in a range of 1 hour or more to 20 hours or less at the heating temperature (maximum value), more preferably in a range of 1 hour or more to 10 hours or less.

According to the second embodiment of the present disclosure, the production method for a thiogallate-based fluorescent material includes the following steps.

Step (A2): A step of preparing a third solution (a2) containing at least one M1 ion selected from the group consisting of strontium (Sr), beryllium (Be), magnesium (Mg), calcium (Ca), barium (Ba) and zinc (Zn), a fourth solution (a3) containing at least one M2 ion selected from the group consisting of europium (Eu) and cerium (Ce), and a second solution (b1) containing a sulfite ion.

Step (B2): A step of simultaneously supplying the third solution (a2), the fourth solution (a3) and the second solution (b1) to a reactor to give a powder containing a sulfite that contains the element M1 and the element M2 in the reaction system that contains the M1 ion, the M2 ion and the sulfite ion.

Step (C): A step of mixing a raw material that contains the powder containing the sulfite that contains the element M1 and the element M2 and a gallium compound, with lithium chloride to give a mixture.

In this, the amount of lithium chloride is in a range of more than 1.7 parts by mass to less than 10.2 parts by mass relative to 100 parts by mass of the gallium element contained in the gallium compound powder.

Step (D): A step of heat-treating the mixture to obtain a thiogallate-based fluorescent material.

In the step (B2), the third solution (a2), the fourth solution (a3) and the second solution (b1) are simultaneously supplied to a reactor, and accordingly, the sulfite ion (anion) and the M1 ion and the M2 ion (cations) react nearly in an equivalent state and therefore the anion and the cation react gently so that the growth of the formed primary particles could take priority over the formation of primary particles and a powder containing a sulfite of large and dense primary particles containing the element M1 and the element M2 can be obtained.
Step (A2)

This is the same as the step (A1) in the first embodiment of the present disclosure, except that the third solution (a2) containing at least one M1 ion selected from the group consisting of strontium, beryllium, magnesium, calcium, barium and zinc and the fourth solution (a3) containing at least one M2 ion selected from the group consisting of europium and cerium are prepared.
Third Solution (a2)

The third solution (a2) is a solution containing at least one M1 ion selected from the group consisting of strontium, beryllium, magnesium, calcium, barium and zinc, in which the same compounds as the compounds containing the element M1 and used in the first solution (a1) in the first embodiment of the present disclosure, and the same solvent as that used therein can be used.

Preferably, the content of the M1 ion in the third solution (a2) is adequately controlled within a range where the compound containing the element M1 can substantially dissolve in the solvent. For example, when $SrCl_2$ is used as the compound containing the element M1 and pure water is used as the solvent, the amount of the element M1 is preferably so controlled as to be contained within a range of 10.0% by mass or more to 20.0% by mass or less as the solid fraction in the total amount of the third solution (a2) and the fourth solution (a3).
Fourth Solution (a3)

The fourth solution (a3) is a solution containing at least one M2 ion selected from the group consisting of europium and cerium, in which the same compounds as the compounds containing the element M2 used in the first solution (a1) and the same solvent as that used therein can be used.

Preferably, the content of the M2 ion in the fourth solution (a3) is adequately controlled within a range where the compound containing the element M2 can substantially dissolve in the solvent. For example, when $EuCl_3$ is used as the compound containing the element M2 and pure water is used as the solvent, the amount of the element M2 is preferably so controlled as to be contained within a range of 0.5% by mass or more to 8.0% by mass or less as the solid fraction in the total amount of the third solution (a2) and the fourth solution (a3).

According to a preferred embodiment of the present disclosure, the production method of a thiogallate-based fluorescent material preferably further includes previously supplying to the reactor a sulfite ion-containing fifth solution (b2) in which the equivalent ratio of the sulfite ion is 0.2 or less relative to 1, the total of the M1 ion and the M2 ion, separately from the second solution (b1) and prior to supplying the second solution (b1) to the reactor. The pre-step (pB) of supplying the sulfite ion-containing fifth solution (b2) to the reactor prior to supplying the second solution (b1) thereto is the same as the pre-step (pB) in the production method of the first embodiment of the present disclosure.
Step (B2)

The third solution (a2), the fourth solution (a3) and the second solution (b1) are separately but simultaneously supplied to the reactor. The step (B2) is the same as the step (B1) in the first embodiment of the present disclosure, except that the third solution (a2) and the fourth solution (a3) are used in place of the first solution (a1).

In this description, "simultaneously" means that there exists a time when all the third solution (a2), the fourth solution (a3) and the second solution (b1) are supplied to the reactor, or the time at which supplying the third solution (a2), the fourth solution (a3) and the second solution (b1) is started is the same. Desirably, the time at which supplying the third solution (a2), the fourth solution (a3) and the second solution (b1) to the reactor is ended is the same, but the end time of supply may somewhat differ.

In the step (B2), a gallium compound may be present in the reaction system. In the step (B2), the gallium in the reaction system may be in an amount to constitute a part of gallium constituting the thiogallate-based fluorescent material.

In a preferred embodiment of the present invention, the method may include solid-liquid separation for the powder containing the sulfite that contains the element M1 and the element M2 after the step (B2). The resultant powder containing the sulfite precipitate that contains the element M1 and the element M2 is dewatered through filtration, dried and sieved in dry. Solid-liquid separation gives the powder containing the sulfite that contains the element M1 and the element M2.

In the production method of producing a thiogallate-based fluorescent material in the second embodiment of the present disclosure, the step (C) and the step (D) are the same as the step (C) and the step (D) in the thiogallate-based fluorescent production method of the first embodiment of the present disclosure.

According to a preferred embodiment of the present disclosure, the thiogallate-based fluorescent material production method preferably further includes a step of classifying the resultant thiogallate-based fluorescent material after the step (D). After heat treatment, by classifying the resultant thiogallate-based fluorescent material, a thiogallate-based fluorescent material having an average particle size of 10 μm or more, as measured according to the F. S. S. S. (Fisher Sub Sieve Sizer) method, can be obtained. A light-emitting device using a fluorescent material smaller than 10 μm tends to have a low relative luminous flux. For classification, for example, the thiogallate-based fluorescent material is dispersed in wet and sieved in wet, and optionally dewatered, dried, and sieved in dry.

According to a preferred embodiment of the present disclosure, the resultant thiogallate-based fluorescent material preferably has a composition represented by the following formula (I).

$$(M1_{1-x}M2_x)Ga_{2-y}S_{4-z} \qquad (I)$$

wherein M1 represents at least one element selected from the group consisting of strontium, beryllium, magnesium, calcium, barium and zinc, M2 represents at least one element selected from the group consisting of europium and cerium, and x, y and z each are numbers satisfying $0.03 \leq x \leq 0.25$, $-0.2 \leq y \leq 0.2$, and $-0.2 \leq z \leq 0.2$.

In the formula (I), where the subscript x satisfies the number $0.03 \leq x \leq 0.25$, the subscript y satisfies the number $-0.2 \leq y \leq 0.2$, and the subscript z satisfies the number $-0.2 \leq z \leq 0.2$, a thiogallate-based fluorescent material having a sufficient emission intensity can be obtained when excited by the light from a light-emitting element capable of emitting blue light having an emission peak wavelength in a range of 420 nm or more and 480 nm or less used as a light source.

According to a preferred embodiment of the present disclosure, the resultant thiogallate-based fluorescent material is represented by the formula (I) where, preferably, M1 is at least one element selected from the group consisting of strontium, calcium and barium, and M2 is europium. The thiogallate-based fluorescent material of the formula (I) where M1 is at least one element selected from the group consisting of strontium, calcium and barium, and M2 is europium can have a large particle size and have a high emission intensity.
Thiogallate-Based Fluorescent Material According to a preferred embodiment of the present disclosure, the thiogallate-based fluorescent material has an average particle diameter (Dm1) measured by the F. S. S. S. (Fisher Sub Sieve Sizer) method in a range of 10.1 μm or more to 25.0 μm or less, and a ratio (Dm2/Dm1) of a median particle diameter (Dm2) measured by the coulter counter method to the average particle diameter (Dm1) measured by the F. S. S. method in a range of 1.0 or more to 2.5 or less, contains at least one element M1 selected from the group consisting of strontium, beryllium, magnesium, calcium, barium and zinc, at least one element M2 selected from the group consisting of europium and cerium, and gallium and sulfur, and contains a lithium element in an amount in a range of 750 ppm or more and 4,000 ppm or less.

The F. S. S. (Fisher Sub Sieve Sizer) method is a kind of air permeability method, in which a specific surface area is measured using air flow resistance and an average value of the particle diameter of primary particles is determined.

The coulter counter method is a method of measuring a particle size based on the coulter counter principle, in which the particle size of particles dispersed in an aqueous electrolytic solution is measured irrespective of primary particles and secondary particles, using the electric resistance of the particles passing through apertures.

Regarding the thiogallate-based fluorescent material whose average particle diameter Dm1, measured according to the F. S. S. method, is in a range of 10.1 μm or more to 25.0 μm or less, the primary particles thereof have a large particle diameter. The average particle diameter Dm1 measured according to the F. S. S. S. method is more preferably in a range of 10.2 μm or more to 20.0 μm or less, even more preferably in a range of 10.5 μm or more to 15.0 μm or less. When the average particle diameter Dm1 of the thiogallate-based fluorescent material is less than 10.1 μm, the particle diameter of the primary particles is small, and in the light-emitting device using the fluorescent material, the relative luminous flux is low. When the average particle diameter Dm1 of the thiogallate-based fluorescent material is more than 25.0 µm, emission intensity greatly lowers owing to the influence of flux.

The ratio (Dm2/Dm1) of the median particle diameter Dm2 measured according to the coulter counter method to the average particle diameter Dm1 measured according to the F. S. S. S. method indicates the ratio of the average particle diameter of the thiogallate-based fluorescent material irrespective of primary particles and secondary particles to the average particle diameter of primary particles. In this description, the median particle diameter Dm2 means an average particle diameter corresponding to 50% in the volume-based cumulative particle size distribution measured according to the coulter counter method.

The ratio Dm2/Dm1 in a range of 1.0 or more and 2.5 or less means that the powder contains a major amount of non-aggregated primary particles though containing secondary particles therein.

When the ratio Dm2/Dm1 is more than 2.5, the amount of secondary particles formed through aggregation of primary particles increases and the material of the type could not maintain a high emission intensity. In general, almost all the particles in the powder are scarcely primary particles and secondary particles are also contained in the powder, and therefore the ratio Dm2/Dm1 is 1.0 or more.

The ratio Dm2/Dm1 is preferably in a range of 1.0 or more and 2.0 or less, more preferably in a range of 1.0 or more and 1.8 or less, even more preferably in a range of 1.0 or more and 1.5 or less.

In the case where lithium chloride is used as the flux, a lithium element may remain in the thiogallate-based fluorescent material. The thiogallate-based fluorescent material contains a lithium element in an amount falling within a range of 750 ppm or more to 4,000 ppm or less. The lithium element content in the thiogallate-based fluorescent material is preferably within a range of 850 ppm or more to 3,500 ppm or less, more preferably within a range of 1,120 ppm or more to 2,800 ppm or less.

When the lithium element content in the thiogallate-based fluorescent material is less than 750 ppm, the amount of lithium chloride acting as a flux is too small and the particle size of the thiogallate-based fluorescent material becomes small. When the lithium element content in the thiogallate-based fluorescent material is more than 4,000 ppm, the emission intensity of the resultant thiogallate-based fluorescent material may lower.

Preferably, the standard deviation of the volume-based particle size distribution of the thiogallate-based fluorescent material, as measured according to the coulter counter method, is 0.5 or less, more preferably 0.4 or less, even more preferably 0.3 or less.

When the standard deviation of the volume-based particle size distribution of the thiogallate-based fluorescent material, as measured according to the coulter counter method, is 0.5 or less, the particle size fluctuation in the material is small and the material can have a uniform particle size, and when the light-emitting device using the material can emit fluorescence with little color unevenness.

According to a preferred embodiment of the present disclosure, the thiogallate-based fluorescent material preferably has a composition represented by the above-mentioned formula (I).

Preferably, the thiogallate-based fluorescent material has a composition of the formula (I) where M1 is at least one element selected from the group consisting of strontium, calcium and barium, and M2 is europium. When the thiogallate-based fluorescent material has a composition of the formula (I) where M1 is at least one element selected from the group consisting of strontium, calcium and barium, and M2 is europium, the material may have a large particle size and secure a high emission intensity. So far as the thiogallate-based fluorescent material having a composition represented by the formula (I) can emit fluorescent in a range of green to yellow green, a part of Ga may be substituted with at least one element selected from the group consisting of Al and In, and a part of S may be substituted with at least one element selected from the group consisting of Se and Te.

Next, the production method for a light-emitting device and the light-emitting device are described.

Production Method for Light-Emitting Device

According to a preferred embodiment of the present disclosure, the production method for a light-emitting device is a method of producing a light-emitting device using the thiogallate-based fluorescent material obtained according to the preferred embodiment of the present disclosure, a light source having an emission peak wavelength in a range of 420 nm or more to 480 nm or less, and a fluorescent material capable of emitting fluorescence in a range of yellow red to red.

Preferably, the resultant light-emitting device has the following constitution.

Light-Emitting Device

According to a preferred embodiment of the present disclosure, the light-emitting device includes the thiogallate-based fluorescent material of the preferred embodiment of the present invention, a light source having an emission peak wavelength in a range of 420 nm or more to 480 nm or less, and a fluorescent material capable of emitting fluorescence in a range of yellow red to red.

One example of the light-emitting device using the thiogallate-based fluorescent material is described with reference to the drawing attached hereto. FIG. 1 is a schematic cross-sectional view showing one example of a light-emitting device 100.

The light-emitting device 100 is provided with a molded article 40, a light-emitting element 10 and a fluorescent member 50. The molded article 40 is integrally composed of a first lead 20, a second lead 30 and a resin part 42 containing a thermoplastic resin or a thermosetting resin. The molded article 40 forms a recess part having a bottom face and a side face, and the light-emitting element 10 is mounted on the bottom face of the recess part. The light-emitting element 10 has a pair of positive and negative electrodes, and the pair of positive and negative electrodes each are individually electrically connected to the first lead 20 and the second lead 30 each via a wire 60. The light-emitting element 10 is covered with the fluorescent member 50. The fluorescent member 50 contains, for example, a fluorescent material 70 for wavelength conversion of the light from the light-emitting element 10, and a resin. Further, the fluorescent material 70 contains a first fluorescent material 71 and a second fluorescent material 72. The first lead 20 and the second lead 30 connected to the pair of positive and negative electrodes of the light-emitting element 10 are partly exposed toward the outside of the package to constitute the light-emitting device 100. Via these first lead 20 and second lead 30, the light-emitting device 100 receives external power to emit light.

Light-Emitting Element

The light-emitting element 10 is used as a light source, and has an emission peak wavelength within a range of 420 nm or more and 480 nm or less. The thiogallate-based fluorescent material of this aspect is efficiently excited by the light from the light source having an emission spectrum within a range of 420 nm or more and 480 nm or less, and can constitute the light-emitting device 100 having a high luminous flux.

As the light-emitting element 10, for example, a semiconductor light-emitting element using a nitride semiconductor ($In_XAl_YGa_{1-X-Y}N$, $0 \leq X$, $0 \leq Y$, $X+Y \leq 1$) is preferably used. The full width at half maximum of the emission spectrum of the light-emitting element 10 may be, for example, 30 nm or less. Using the semiconductor light-emitting element as a light source, a light-emitting device having a high efficiency and a high linearity of output to input and having high mechanical impact resistance can be obtained.

First Fluorescent Material

The light-emitting device 100 contains the thiogallate-based fluorescent material of a preferred embodiment of the present invention as the first fluorescent material 71. Preferably, the thiogallate-based fluorescent material is one having the composition represented by the above-mentioned formula (I). The first fluorescent material 71 is excited by the light from the light source and emits fluorescence in a range of green to yellow green.

The first fluorescent material mainly contains the above-mentioned thiogallate-based fluorescent material, and is, for example, contained in the fluorescent member 50 to cover the light-emitting element 10. In the light-emitting device 100 where the light-emitting element 10 is covered with the fluorescent member 50 that contains the first fluorescent material 71, a part of the light emitted by the light-emitting element 10 is absorbed by the thiogallate-based fluorescent material and is emitted as green light. Using the light-emitting element 10 that emits light having an emission peak wavelength in a range of 420 nm or more and 480 nm or less, a light-emitting device having a high luminous flux can be provided.

The content of the first fluorescent material 71 may be, for example, 10 parts by mass or more and 200 parts by mass or less relative to the resin (100 parts by mass), and is preferably 2 parts by mass or more and 40 parts by mass or less.

Second Fluorescent Material

Preferably, the fluorescent member 50 contains the second fluorescent material 72 differing form the first fluorescent material 71 in the emission peak wavelength. Preferably, the second fluorescent material 72 contains a fluorescent material capable of emitting fluorescence in a range of yellow red to red. One alone or two or more kinds of second fluorescent materials may be used either singly or as combined.

Preferably, the second fluorescent material 72 is at least one selected from the group consisting of fluoride-based fluorescent materials, magnesium fluorogermanate-based fluorescent materials, nitride-based fluorescent materials and sulfide-based fluorescent materials. When the second fluorescent material 72 is at least one selected from these kinds of fluorescent materials, the range of the color reproducibility of the light-emitting device can be enlarged.

Preferably, the second fluorescent material 72 contains a manganese-activated fluoride fluorescent material that is excited by light from the light source and emits fluorescence in a range of yellow red to red.

The manganese-activated fluoride fluorescent material is preferably a fluoride fluorescent material having a composition represented by the following formula (II).

$$A_2[M3_{1-u}Mn^{4+}{}_uF_6] \quad (II)$$

wherein A represents at least one cation selected from the group consisting of $K^+$, $Li^+$, $Na^+$, $Rb^+$, $Cs^+$ and $NH_4^+$, M3 represents at least one element selected from the group consisting of a Group 4 element and a Group 14 element, and u is a number satisfying $0 < u < 0.2$.

The light-emitting device 100 is adequately equipped with the light-emitting element 10 capable of emitting light having an emission peak wavelength in a range of 420 nm or more and 480 nm or less, the first fluorescent material 71 that contains the thiogallate-based fluorescent material to be excited by the light, and the second fluorescent material 72 that contains the fluorescent material capable of emitting fluorescence in a range of yellow red to red, and therefore has a broad color reproduction range and good color rendering properties.

Fluorescent Member

The first fluorescent material 71 and the second fluorescent material 72 (hereinafter these may be simply referred to as "fluorescent material 70" as combined) constitute the fluorescent member 50 to cover the light-emitting element along with a sealant material. The sealant material to constitute the fluorescent member 50 includes a silicone resin, an epoxy resin, etc.

The total content of the fluorescent material 70 in the fluorescent member 50 may be, for example, in a range of 5 parts by mass or more and 300 parts by mass or less relative to the resin (100 parts by mass), and is preferably in a range of 10 parts by mass or more and 250 parts by mass or less, more preferably in a range of 15 parts by mass or more and 230 parts by mass or less, even more preferably in a range of 15 parts by mass or more and 200 parts by mass or less. When the total content of the fluorescent material 70 in the fluorescent member 50 falls within the range, the fluorescent material can efficiently convert the wavelength of the light emitted by the light-emitting element 10.

The fluorescent member 50 may further contain a filler, a light diffuser and the like in addition to the sealant material and the fluorescent material 70. For example, containing a light diffuser, the member can relieve the directionality from the light-emitting element 10 and can therefore enlarge the viewing angle. The filler may additionally have a function as a light diffuser. Examples of the filler include silica, titanium oxide, zinc oxide, zirconium oxide, alumina, etc. In the case where the fluorescent member 50 contains a filler, the filler content may be, for example, 1 part by mass or more and 20 parts by mass or less relative to the resin (100 parts by mass).

The fluorescent member 50 functions not only as a wavelength conversion member containing the fluorescent material 70 but also as a member for protecting the light-emitting element 10, the first fluorescent material 71 and the second fluorescent material 72 from external environments.

In FIG. 1 showing one example of the light-emitting device 100 of this embodiment, the first fluorescent material 71 and the second fluorescent material 72 are eccentrically located in the vicinity of the light-emitting element 10. Namely, in the fluorescent member 50, the first fluorescent material 71 and the second fluorescent material 72 are arranged more in the fluorescent member 50 close to the first lead 20 and the second lead 30 on which the light-emitting device 10 to constitute the bottom face of the recess part of the light-emitting device 100 is mounted, than in the fluorescent member 50 close to the top face of the molded article 40. In that manner, when the first fluorescent material 71 and the second fluorescent material 72 are arranged to be close to the light-emitting element 10, the light-emitting device can efficiently convert the wavelength of the light from the light-emitting element 10 and can have excellent emission efficiency. Regarding the arrangement configuration of the first fluorescent material 71 and the second fluorescent material 72 in the fluorescent member 50, the materials are not limited to be arranged close to the light-emitting element 10 but, for example, in order that the influence of heat from the light-emitting element 10 onto the first fluorescent material 71 and the second fluorescent material 72 could be reduced, the first fluorescent material 71 and the second fluorescent material 72 may be so arranged as to be spaced from the light-emitting element 10 in the fluorescent member 50. In addition, for reducing color unevenness of the light from the light-emitting device 100, the first fluorescent material 71 and the second fluorescent material 72 may be nearly uniformly dispersed entirely in the fluorescent member 50.

As shown in FIG. 1, in the light-emitting device 100, the first fluorescent material 71 and the second fluorescent material 72 may be arranged around the light-emitting element 10 in a state where the first fluorescent material 71 and the second fluorescent material 72 are mixed therein.

EXAMPLES

The present disclosure will be more specifically described by way of Examples, but the present invention will not be limited to these Examples.
Thiogallate-Based Fluorescent Material Example 1

Step (A1)
2475 g of a strontium chloride ($SrCl_2$) solution containing 16% by mass of strontium (Sr) and 927 g of a europium chloride ($EuCl_3$) solution containing 10% by mass of europium (Eu) were mixed in pure water to prepare a first solution (a1) having a total amount of 3 L. The first solution (a1) had a pH of 0.8 and a temperature of 25° C.

1,000 g of ammonium sulfite $(NH_4)_2SO_3$ (manufactured by Wako Pure Chemical Industries, Ltd.) was dissolved in pure water so that the equivalent ratio of the sulfite ion (mol) in a second solution (b1) to the total amount, 1.00 mol of the strontium ion and the europium ion (Sr ion (mol)+Eu ion (mol)) in the first solution (a1) could be 1.15, to prepare the second solution (b1) having a total amount of 3.36 L. Further, using hydrochloric acid (HCl), the pH of the second solution (b1) was controlled to be 7.5, and the temperature thereof was 20° C.
Pre-Step (pB)
0.36 L of the second solution (b1) was used as a fifth solution (b2). A mixed solution of 4 L of pure water and 0.36 L of the fifth solution (b2) was controlled to have a temperature of 18° C., using ice produced with pure water, and put into a reactor having a volume of 50 L. The equivalent ratio of the sulfite ion (mol) in the fifth solution (b2) to the total amount, 1.00 (mol) of the strontium ion and the europium ion was 0.12. The mixed solution of pure water and the fifth solution (b2) had a pH of 8.
Step (B1)
The mixed solution of pure water and the fifth solution (b2) in the reactor was stirred with a stirrer (stirring blade shape: pitched paddle, revolution: 150 rpm).

While the mixed solution in the reactor was stirred, each of the first solution (a1) and the second solution (b1) was separately but simultaneously dripped into the reactor, at a rate of 100 mL/min, using a tube-type quantitative pump (MASTERFLEX manufactured by YAMATO SCIENTIFIC Co., Ltd.).

Each of the first solution (a1) and the second solution (b1) was separately but simultaneously dripped into the reactor, taking 30 minutes, so that the temperature of the reaction system during the dripping addition was controlled to be 20±5° C. and the pH thereof was to be 5.5±0.5. Simultaneously with the termination of supply to the reaction system, the reaction of the strontium ion, the europium ion and the sulfite ion was terminated.

Using hydrochloric acid (HCl), the pH of the reaction system in the reactor was controlled to be 5.5.

The temperature of the reaction system (liquid temperature) was 18° C.

The sulfite $(Sr,Eu)SO_3$ for a thiogallate-based fluorescent material precipitated in the reaction system was separated by filtration, dried, and then classified through a dry sieve to give a powder of the sulfite $(Sr,Eu)SO_3$. The average particle diameter of the resultant sulfite $(Sr,Eu)SO_3$ powder, as measured according to the F. S. S. S. method, was 3.5 μm, and the median particle diameter thereof, as measured according to the coulter counter method, was 6.9 μm. The average particle diameter of the powder containing the sulfite according to the F. S. S. S. method, and the median particle diameter of the powder containing the sulfite according to the coulter counter method were measured in the same manner as that for measuring the average particle diameter Dm1 and the medium particle diameter Dm2 of the thiogallate-based fluorescent material to be described hereinunder.
Step (C)
The resultant powder of sulfite $(Sr,Eu)SO_3$ and a gallium oxide $(Ga_2O_3)$ powder were mixed such that twice the total molar amount of the strontium element and the europium element relative to the gallium element (mol) satisfies 0.95 (2×(Sr (mol)+Eu (mol))/Ga (mol)=0.95), thereby preparing a raw material that contains the powder containing the sulfite with Sr and Eu and the gallium oxide powder. 3.4 parts by mass, relative to 100 parts by mass of the gallium element contained in the gallium oxide $(Ga_2O_3)$ powder, of lithium chloride was added and mixed to prepare a mixture.
Step (D)
The resultant mixture was put in a quartz crucible and heat-treated in a tubular furnace under a hydrogen sulfide atmosphere with a hydrogen sulfide ($H_2S$) concentration of 95% by volume or greater at 0.1 MPa (normal pressure), at 900° C. for 2 hours to thereby give a thiogallate-based fluorescent material.
Classification
The resultant thiogallate-based fluorescent material was wet-dispersed in pure water, and classified through a nylon mesh wet sieve having a sieve opening of 10 μm. Subsequently, this was processed for solid-liquid separation, dewatered, dried, and classified through a nylon mesh dry sieve having a sieve opening of 75 μm. After classification, a thiogallate-based fluorescent material having a composition of $(Sr_{0.88}Eu_{0.12})Ga_2S_4$ and having an average particle diameter, as measured according to the F. S. S. S. (Fisher Sub Sieve Sizer) method, of 14.2 μm was obtained.

Comparative Example 1

In the same manner as in the step (A1) in Example 1, the first solution (a1) and the second solution (b1) were prepared.

A sulfite (Sr, Eu)$SO_3$ powder was produced in the same manner as in the step (B1) in Example 1, except that, in the step (B1), 4 L of pure water and 3.36 L of the second solution (b1) were previously put into the reactor having a volume of 50 L, and while the mixed solution containing pure water and the second solution (b1) in the reactor was stirred with a stirrer (stirring blade shape: pitched paddle, revolution: 150 rpm), the first solution (a1) was then dropwise added to the mixed solution in the reactor, using a tube-type quantitative pump (MASTERFLEX manufactured by YAMATO SCIENTIFIC Co., Ltd.), at a rate of 100 mL/min and taking 30 minutes. The average particle diameter, as measured according to the F. S. S. S. method, of the resultant sulfite (Sr, Eu)SO$_3$ powder was 1.7 and the volume-based 50% average particle diameter thereof was 4.0 μm.

A mixture was prepared in the same manner as in the step (C) in Example 1 except that lithium chloride was not used.

The resultant mixture was heat-treated in the same manner as in the step (D) in Example 1 to give a thiogallate-based fluorescent material. The thiogallate-based fluorescent material was not classified to be a thiogallate-based fluorescent material having a composition of $(Sr_{0.88}Eu_{0.12})Ga_2S_4$.

Comparative Example 2

A thiogallate-based fluorescent material having a composition of $(Sr_{0.88}Eu_{0.12})Ga_2S_4$ was produced in the same manner as in Example 1, except that lithium chloride was not used in the step (C) and classification after the step (D) was omitted.

Example 2

A thiogallate-based fluorescent material having a composition of $(Sr_{0.88}Eu_{0.12})Ga_2S_4$ was produced in the same manner as in Example 1, except that classification after the step (D) was omitted.

Comparative Examples 3 to 12

Thiogallate-based fluorescent materials having a composition of $(Sr_{0.88}Eu_{0.12})Ga_2S_4$ of Comparative Examples 3 to 12 were produced in the same manner as in Example 1, except that sodium chloride (NaCl), potassium chloride (KCl), rubidium chloride (RbCl), magnesium chloride (MgCl$_2$), calcium chloride (CaCl$_2$), strontium chloride (SrCl$_2$), barium chloride (BaCl$_2$), lithium fluoride (LiF), lithium bromide (LiBr) or lithium iodide (LiI) was used in place of lithium chloride in the step (C) and classification after the step (D) was omitted.

Comparative Example 13

A thiogallate-based fluorescent material having a composition of $(Sr_{0.88}Eu_{0.12})Ga_2S_4$ was produced in the same manner as in Example 1, except that, in the step (C), lithium chloride was added in an amount of 1.7 parts by mass relative to 100 parts by mass of the gallium element contained in the gallium oxide (Ga$_2$O$_3$) powder, and classification after the step (D) was omitted.

Comparative Example 14

A thiogallate-based fluorescent material having a composition of $(Sr_{0.88}Eu_{0.12})Ga_2S_4$ was produced in the same manner as in Example 1, except that, in the step (C), lithium chloride was added in an amount of 10.2 parts by mass relative to 100 parts by mass of gallium contained in the gallium oxide (Ga$_2$O$_3$) powder, and classification after the step (D) was omitted.

Light-Emitting Device Using Thiogallate-Based Fluorescent Material

Light-Emitting Devices of Example 1, Comparative Examples 1 and 2

Using the thiogallate-based fluorescent material of Example 1, Comparative Example 1 or Comparative Example 2 as the first fluorescent material 71, and using a red fluorescent material containing a manganese-activated fluoride fluorescent material having a composition represented by K$_2$SiF$_6$:Mn as the second fluorescent material 72, a silicone resin was mixed and dispersed therein and defoamed to give a composition for the fluorescent member 50. In the composition, the fluorescent material 70 was contained in an amount of 55 parts by mass relative to 100 parts by mass of the resin therein. Relative to 100% by mass of the total of the first fluorescent material 71 and the second fluorescent material 72, the first fluorescent material 71 was contained in an amount of 5% by mass and the second fluorescent material 72 was in an amount of 95% by mass. In the composition for the fluorescent member, the blend ratio of the first fluorescent material 71 and the second fluorescent material 72 was so controlled that the mixed light to be emitted by the light-emitting device to be produced could be in the xy chromaticity coordinate defined in CIE 1931 where x is around 0.28 and y is around 0.27 (x=0.28, y=0.27). After a blue-emitting LED (light-emitting device) having an emission peak wavelength of 455 nm was mounted on the first lead 20, and the composition for the fluorescent member 50 was charged on the blue-emitting LED 10 and cured to form the fluorescent member 50, thereby producing the light-emitting device 100 shown in FIG. 1 containing the thiogallate-based fluorescent material of Example 1, Comparative Example 1 or Comparative Example 2.

Evaluation of Thiogallate-Based Fluorescent Material

According to the following methods, the thiogallate-based fluorescent materials of Examples 1 and 2 and Comparative Examples 1 to 14 were evaluated.

Average Particle Diameter Dm1 according to F. S. S. S. Method

The average particle diameter Dm1 (μm) of the powders of the thiogallate-based fluorescent materials of Examples 1 and 2 and Comparative Examples 1 to 14 was measured according to the F. S. S. S. method using Fisher Sub-Sieve Sizer Model 95 (manufactured by Fisher Scientific Company). The results are shown in Table 1 and Table 2.

Median Particle Diameter of Dm2 according to Coulter Counter Method

Using a particle size distribution measurement apparatus (product name: CMS, manufactured by Coulter Counter), the median particle diameter Dm2 (μm) and the volume-based particle size distribution standard deviation (clog) of the powders of the thiogallate-based fluorescent materials of Example 1, Comparative Example 1 and Comparative Example 2 were measured according to the coulter counter method. The results are shown Table 1. The median particle diameter Dm2 means the average particle diameter corresponding to 50% in the volume-based cumulative particle size distribution measured according to the coulter counter method.

Relative Emission Intensity

The relative emission intensity of the thiogallate-based fluorescent materials of Examples 1 and 2 and Comparative Examples 1 to 14 was measured. The emission intensity of each fluorescent material was measured by reflection of light from a light source having an excitation wavelength of 460 nm at room temperature (25° C.±5° C.), using a fluorescence spectrophotometer (product name: F-4500, manufactured by Hitachi High-Tech Science Corporation). Based on the emission intensity of the thiogallate-based fluorescent material of Comparative Example 1, referred to as 100%, the emission intensity of each fluorescent material was expressed as a relative emission intensity (%). The results are shown in Table 1 and Table 2.

Measurement of Element Content

Using an inductively coupled plasma emission spectrometer (manufactured by Perkin Elmer Corporation), the lithium element (Li) content and the chlorine element (Cl) content in the thiogallate-based fluorescent materials of Example 1, Comparative Example 1 and Comparative Example 2 were measured. The results are shown in Table 1.

Evaluation of Light-Emitting Device

Relative Luminous Flux

The light-emitting devices of Example 1, Comparative Example 1 and Comparative Example 2 using the thiogallate-based fluorescent materials of Example 1, Comparative Example 1 and Comparative Example 2 were analyzed to measure the luminous flux using a total flux measuring apparatus using an integrating sphere. Based on the luminous flux in the light-emitting device of Comparative Example 1, referred to as 100%, the relative luminous flux of the light-emitting devices of Example 1 and Comparative Example 2 was calculated. The results are shown in Table 1.

solution (a1) and the second solution (b1) to the reactor in the step (B1) in Example 1 contained primary particles having a larger particle size and contained uniform particles, as compared with the powder containing the sulfite obtained by supplying the first solution (a1) to the second solution (b1) in Comparative Example 1. In addition, the thiogallate-based fluorescent material of Example 1 obtained using the resultant powder containing the sulfite and lithium chloride had a larger average particle diameter and a uniform particle diameter and had a higher relative emission intensity, as compared with the thiogallate-based fluorescent material of Comparative Example 1 produced not using lithium chloride.

Regarding the thiogallate-based fluorescent material of Example 1, the ratio of the median particle diameter Dm2 measured according to the coulter counter method to the average particle diameter Dm1 measured according to the F. S. S. S. method (Dm2/Dm1) thereof was 1.3 and was nearer to 1 than that of the thiogallate-based fluorescent material of Comparative Example 1, which confirmed that the thiogallate-based fluorescent material of Example 1 contained a major amount of non-aggregated primary particles though containing secondary particles therein.

As shown in Table 1, the average particle diameter of the thiogallate-based fluorescent material obtained in Example 1 was large though the relative emission intensity thereof was low, as compared with the thiogallate-based fluorescent

TABLE 1

| | Sulfite | | | Thiogallate-Based Fluorescent Material | | | | | | | |
|---|---|---|---|---|---|---|---|---|---|---|---|
| | Average Particle Diameter (μm) by F. S. S. S. Method | Median Particle Diameter (μm) | Standard Deviation (σlog) | Average Particle Diameter Dm1 (μm) by F. S. S. S. Method | Median Particle Diameter Dm2 (μm) | Ratio of Dm2/Dm1 | Standard Deviation (σlog) | Relative Emission Intensity (%) | Li (ppm) | Cl (ppm) | Relative Luminous Flux (%) |
| Example 1 | 3.5 | 6.9 | 0.279 | 14.2 | 18.8 | 1.3 | 0.287 | 105.5 | 1400 | less than 10 | 101.7 |
| Comparative Example 1 | 0.7 | 9.7 | 0.674 | 2.5 | 4.3 | 1.7 | 0.427 | 100.0 | less than 5 | less than 10 | — |
| Comparative Example 2 | 3.5 | 6.9 | 0.279 | 5.2 | 7.1 | 1.4 | 0.358 | 114.2 | less than 5 | less than 10 | 100.0 |

TABLE 2

| | Mixture (flux) | Amount of Flux Added (part by mass) | Average Particle Diameter Dm1 (μm) by F. S. S. S. Method | Relative Emission Intensity (%) |
|---|---|---|---|---|
| Example 2 | LiCl | 3.4 | 10.4 | 103.1 |
| Comparative Example 3 | NaCl | 3.4 | 9.3 | 96.6 |
| Comparative Example 4 | KCl | 3.4 | 7.8 | 55.7 |
| Comparative Example 5 | RbCl | 3.4 | 6.6 | 65.4 |
| Comparative Example 6 | $MgCl_2$ | 3.4 | 6.8 | 112.8 |
| Comparative Example 7 | $CaCl_2$ | 3.4 | 6.3 | 113.5 |
| Comparative Example 8 | $SrCl_2$ | 3.4 | 6.4 | 112.8 |
| Comparative Example 9 | $BaCl_2$ | 3.4 | 6.6 | 113.6 |
| Comparative Example 10 | LiF | 3.4 | 21.4 | 70.3 |
| Comparative Example 11 | LiBr | 3.4 | 7.7 | 100.1 |
| Comparative Example 12 | LiI | 3.4 | 8.0 | 94.9 |
| Comparative Example 13 | LiCl | 1.7 | 10.4 | 99.0 |
| Comparative Example 14 | LiCl | 10.2 | 27.5 | 56.6 |

As shown in Table 1, the powder containing the sulfite obtained by separately but simultaneously supplying the first material of Comparative Example 2 obtained using the same sulfite as that in Example 1 but not using lithium chloride. In addition, the light-emitting device using the thiogallate-based fluorescent material of Example 1 had a higher relative luminous flux than that of the light-emitting device of Comparative Example 2.

Though not classified, the thiogallate-based fluorescent material of Example 2 shown in Table 2 had a large average particle size and had a higher relative emission intensity than the thiogallate-based fluorescent material of Comparative Example 1.

As shown in Table 2, the thiogallate-based fluorescent materials of Comparative Examples 3 to 5 were obtained using sodium chloride (NaCl), potassium chloride (KCl) or rubidium chloride (RbCl) of an alkali metal chloride different from lithium chloride, and the relative emission intensity thereof was low and the average particle diameter thereof was small.

The thiogallate-based fluorescent materials of Comparative Examples 6 to 9 were obtained using magnesium chloride ($MgCl_2$), calcium chloride ($CaCl_2$), strontium chloride ($SrCl_2$) or barium chloride ($BaCl_2$) of an alkaline earth metal halide different from lithium chloride, and the relative emission intensity thereof was high but the average particle diameter thereof was small.

The thiogallate-based fluorescent material of Comparative Example 10 was obtained using lithium fluoride (LiF) of a lithium halide different from lithium chloride in the mixing step. The thiogallate-based fluorescent material of Comparative Example 10 had a large average particle diameter but the relative emission intensity thereof was low.

The thiogallate-based fluorescent material of Comparative Example 11 was obtained using lithium bromide (LiBr). The thiogallate-based fluorescent material of Comparative Example 11 maintained the relative emission intensity but the average particle diameter thereof was small.

The thiogallate-based fluorescent material of Comparative Example 12 was obtained using lithium iodide (LiI). The thiogallate-based fluorescent material of Comparative Example 12 had a low relative emission intensity and the average particle diameter thereof was small.

The thiogallate-based fluorescent material of Comparative Example 13 was obtained using 1.7 parts by mass of lithium chloride. The relative emission intensity of the thiogallate-based fluorescent material of Comparative Example 13 was low.

The thiogallate-based fluorescent material of Comparative Example 14 was obtained using 10.2 parts by mass of lithium chloride. The thiogallate-based fluorescent material of Comparative Example 14 had a large average particle diameter, but the relative emission intensity thereof was extremely low.

According to preferred embodiments of the present disclosure, a thiogallate-based fluorescent material having a large particle size can be obtained while preventing the emission intensity thereof from lowering. According to preferred embodiments of the present disclosure, the thiogallate-based fluorescent material can be used, as combined with a light-emitting element to be an excitation source therein, in a light-emitting device for use for lightings for white emission, car-mounted lightings, displays, liquid-crystal backlights, etc.

The invention claimed is:

1. A method of producing a thiogallate-based fluorescent material, comprising:
preparing a first solution a1 containing at least one M1 ion selected from the group consisting of strontium, beryllium, magnesium, calcium, barium and zinc, and at least one M2 ion selected from the group consisting of europium and cerium, and a second solution b1 containing a sulfite ion,
simultaneously supplying the first solution a1 and the second solution b1 to a reactor to obtain a powder containing a sulfite that contains an element M1 and an element M2 in a reaction system that contains the M1 ion, the M2 ion and the sulfite ion,
mixing a raw material that contains the powder containing the sulfite that contains the element M1 and the element M2 and a powder containing a gallium compound, with lithium chloride to obtain a mixture, and
heat-treating the mixture to obtain a thiogallate-based fluorescent material, wherein:
the amount of lithium chloride is in a range of more than 1.7 parts by mass to less than 10.2 parts by mass relative to 100 parts by mass of the gallium element contained in the powder containing the gallium compound, and a pH of the reaction system is controlled to fall within a range of 5.0 or more to 8.5 or less.

2. The method of producing a thiogallate-based fluorescent material according to claim 1, further comprising:
classifying after the heat-treating to obtain a thiogallate-based fluorescent material having an average particle diameter measured according to the F. S. S. S. (Fisher Sub Sieve Sizer) method of 10 μm or more.

3. The method of producing a thiogallate-based fluorescent material according to claim 1, wherein the thiogallate-based fluorescent material has a composition represented by the following formula (I):

$$(M1_{1-x}M2_x)Ga_{2-y}S_{4-z} \quad (I)$$

wherein M1 represents at least one element selected from the group consisting of strontium, beryllium, magnesium, calcium, barium and zinc, M2 represents at least one element selected from the group consisting of europium and cerium, and x, y and z each satisfy $0.03 \leq x \leq 0.25$, $-0.2 \leq y \leq 0.2$, and $-0.2 \leq z \leq 0.2$.

4. The method of producing a thiogallate-based fluorescent material according to claim 3, wherein in the formula (I), M1 is at least one element selected from the group consisting of strontium, calcium and barium, and M2 is europium.

5. The method of producing a thiogallate-based fluorescent material according to claim 1, wherein an equivalent ratio of the sulfite ion contained in the second solution b1 to the total of the M1 ion and the M2 ion is 1.01 or more and 1.30 or less.

6. The method of producing a thiogallate-based fluorescent material according to claim 1, wherein a pH of the second solution b1 is controlled to fall within a range of 7.0 or more to 8.5 or less.

7. The method of producing a thiogallate-based fluorescent material according to claim 1, which comprises supplying to the reactor a sulfite ion-containing solution b2 in which an equivalent ratio of the sulfite ion is 0.2 or less relative to the total of the M1 ion and the M2 ion, separately from the second solution b1 prior to supplying the second solution b1 to the reactor.

8. The method of producing a thiogallate-based fluorescent material according to claim 7, wherein a pH of the solution b2 is controlled to fall within a range of 7.0 or more to 8.5 or less.

9. The method of producing a thiogallate-based fluorescent material according to claim 1, wherein the pH of the reaction system is controlled to fall within a range of 5.0 or more to 6.0 or less.

10. The method of producing a thiogallate-based fluorescent material according to claim 1, wherein a temperature of the reaction system is in a range of 15° C. or higher to 30° C. or lower.

11. A method of producing a thiogallate-based fluorescent material, comprising:
preparing a solution a2 containing at least one M1 ion selected from the group consisting of strontium, beryllium, magnesium, calcium, barium and zinc, a solution a3 containing at least one M2 ion selected from the group consisting of europium and cerium, and a solution b1 containing a sulfite ion,
simultaneously supplying the solution a2, the solution a3 and the solution b1 to a reactor to obtain a powder containing a sulfite that contains an element M1 and an element M2 in a reaction system that contains the M1 ion, the M2 ion and the sulfite ion, mixing a raw material that contains the powder containing the sulfite that contains the element M1 and the element M2 and a powder containing a gallium compound, with lithium chloride to obtain a mixture, and heat-treating the mixture to obtain a thiogallate-based fluorescent material, wherein:

the amount of lithium chloride is in a range of more than 1.7 parts by mass to less than 10.2 parts by mass relative to 100 parts by mass of the gallium element contained in the powder containing the gallium compound, and a pH of the reaction system is controlled to fall within a range of 5.0 or more to 8.5 or less.

12. The method of producing a thiogallate-based fluorescent material according to claim 11, further comprising:

classifying after the heat-treating to obtain a thiogallate-based fluorescent material having an average particle diameter measured according to the F. S. S. S. (Fisher Sub Sieve Sizer) method of 10 μm or more.

13. The method of producing a thiogallate-based fluorescent material according to claim 11, wherein the thiogallate-based fluorescent material has a composition represented by the following formula (I):

$$(M1_{1-x}M2_x)Ga_{2-y}S_{4-z} \quad (I)$$

wherein M1 represents at least one element selected from the group consisting of strontium, beryllium, magnesium, calcium, barium and zinc, M2 represents at least one element selected from the group consisting of europium and cerium, and x, y and z each satisfy $0.03 \leq x \leq 0.25$, $-0.2 \leq y \leq 0.2$, and $-0.2 \leq z \leq 0.2$.

14. The method of producing a thiogallate-based fluorescent material according to claim 13, wherein in the formula (I), M1 is at least one element selected from the group consisting of strontium, calcium and barium, and M2 is europium.

15. The method of producing a thiogallate-based fluorescent material according to claim 11, wherein an equivalent ratio of the sulfite ion contained in the solution b1 to the total of the M1 ion and the M2 ion is 1.01 or more and 1.30 or less.

16. The method of producing a thiogallate-based fluorescent material according to claim 11, wherein a pH of the solution b1 is controlled to fall within a range of 7.0 or more to 8.5 or less.

17. The method of producing a thiogallate-based fluorescent material according to claim 11, which comprises supplying to the reactor a sulfite ion-containing solution b2 in which an equivalent ratio of the sulfite ion is 0.2 or less relative to the total of the M1 ion and the M2 ion, separately from the solution b1 prior to supplying the solution b1 to the reactor.

18. The method of producing a thiogallate-based fluorescent material according to claim 17, wherein a pH of the solution b2 is controlled to fall within a range of 7.0 or more to 8.5 or less.

19. The method of producing a thiogallate-based fluorescent material according to claim 11, wherein the pH of the reaction system is controlled to fall within a range of 5.0 or more to 6.0 or less.

20. The method of producing a thiogallate-based fluorescent material according to claim 11, wherein a temperature of the reaction system is in a range of 15° C. or higher to 30° C. or lower.

* * * * *